United States Patent [19]

Chin et al.

[11] Patent Number: 4,477,964

[45] Date of Patent: Oct. 23, 1984

[54] METHOD OF MAKING P-I-N PHOTODIODES

[75] Inventors: Aland K. Chin, Berkeley Heights; Bulusu V. Dutt, Parsippany, both of N.J.

[73] Assignee: AT&T Bell Laboratories, Murray Hill, N.J.

[21] Appl. No.: 538,182

[22] Filed: Oct. 3, 1983

Related U.S. Application Data

[60] Division of Ser. No. 402,921, Jul. 29, 1982, Pat. No. 4,443,809, which is a continuation of Ser. No. 154,046, May 28, 1980.

[51] Int. Cl.³ ............... H01L 29/161; H01L 29/90; H01L 27/14
[52] U.S. Cl. ..................... 29/572; 148/189; 148/190; 252/950; 357/16; 357/30; 357/58; 357/90
[58] Field of Search ............... 29/572; 148/189, 190; 357/13, 16, 30, 58, 90; 252/950

[56] References Cited

U.S. PATENT DOCUMENTS 4,274,103  6/1981  Yamamoto ..................... 357/13

OTHER PUBLICATIONS

Lee et al., "High Avalanche Gain in Small-Area InP Photodiodes", *Appl. Phys. Lett.*, vol. 35, No. 7, pp. 511-513, Oct. 1979.
Burrus et al., "InGaAsP P-I-N Photodiodes with Low Dark Current and Small Capacitance", *Electronics Lett.*, vol. 15, No. 20, pp. 655-657, Sep. 1979.
Tien et al., "Diffusion of Cd Acceptors in InP and a Diffusion Theory for III-V Semiconductors", *Appl. Phys. Lett.*, vol. 34, No. 10, pp. 701-704, May 1979.
Tuck et al., "Anomalous Diffusion Profiles of Zinc in GaAs", *J. of Material Sci.*, vol. 7, pp. 585-591, 1972.
Takanashi et al., "Effect of Impurity Diffusion on the Characteristics of Avalanche Photodiode," *Japanese Journal of Applied Physics*, vol. 19, No. 4, pp. 687-691, (Apr. 1980).
Miller et al., "Two Diffusion Regions Observed in the Cd Diffusion of InP," 21st EMC, Abs. No. G-4, (Jun. 1979).
Tuck et al., "Diffusion Profiles of Zinc in Indium Phosphide," Journal of Physics D: Applied Physics, vol. 8, pp. 1806-1821, (1975).
Seltzer, "Diffusion of Manganese Into Gallium Arsenide," Journal of Physical Chemistry Solids, vol. 26, pp. 243-250, (1965).
Woodbury, "Diffusion and Solubility of Ag in CdS," Journal of Applied Physics, vol. 36, No. 7, pp. 2287-2293, (Jul. 1965).
Chang, "Diffusion and Solubility of Zinc in Gallium Phosphide Single Crystals," Journal of Applied Physics, vol. 35, No. 2, pp. 374-378, (Feb. 1964).
van der Maesen et al., "On the Behavior of Rapidly Diffusing Acceptors in Germanium," Journal of Electrochemical Society, vol. 102, pp. 229-234, (May 1954).
H. Ando et al., "Carrier Density Profiles in Zn- and Cd-Diffused InP," Journal of Applied Physics, vol. 20, No. 3, pp. 197-200, (Mar. 1981).
S. Aytac et al., "Shallow and Selective Diffusion of Zinc in Indium Phosphide," Solid-State Electronics, vol. 24, pp. 57-61, (1981).
A. Hooper et al., "Diffusion of Zinc in Indium Phosphide at 700° C.," Solid-State Electronics, vol. 17, pp. 531-538, (1974).

*Primary Examiner*—Aaron Weisstuch
*Assistant Examiner*—Hunter L. Auyang
*Attorney, Agent, or Firm*—Michael J. Urbano

[57] ABSTRACT

Photodiodes (10) are fabricated in a single step diffusion process which exploits the characteristic of certain acceptors to form an anomalous diffusion profile (VI) including shallow and deep fronts (VIa and b) joined by an upwardly concave segment (VIc). By performing this type of diffusion into a low-doped $n^-$-type body (12) with a carrier concentration (VII) below that of the concave segment, a $p^+$—$p^-$ junction (15) is formed at the depth of the concave segment and a $p^-$—$n^-$ junction (17) is formed at a greater depth. The zone (16) between the junctions is at least partially depleted and forms the active region of a $p^+$—$p^-$—$n^-$ photodiode. Specifically described are InP:Cd photodiodes.

8 Claims, 3 Drawing Figures

METHOD OF MAKING P-I-N PHOTODIODES

This application is a division of application Ser. No. 402,921, filed July 29, 1982, now U.S. Pat. No. 4,443,809, which is a continuation of application Ser. No. 154,046 filed on May 28, 1980.

BACKGROUND OF THE INVENTION

This invention relates to detectors of optical radiation (i.e., lightwaves) and, more particularly, to semiconductor photodiodes.

The recent special issue of the Western Electric Engineer, Vol. XXIV, No. 1, Winter 1980, is a graphic illustration of the burgeoning interest in lightwave communicates systems, especially fiber optic systems. The rapid growth of these systems has engendered commensurate activity in optical sources and detectors, primarily GaAs-AlGaAs laser diodes and LEDs in conjunction with Si APDs and p-i-n diodes for present applications at relatively short wavelengths (e.g., 0.80-0.90 $\mu$m), and InP-InGaAsP laser diodes and photodiodes for future systems at longer wavelengths (e.g., 1.1-1.6 $\mu$m).

In general, a photodiode operates by the absorption of light which generates electron-hole pairs in the depletion region of a p-n junction. In the photovoltaic mode or under reverse bias, the junction field separates the pairs and thereby produces a photocurrent which can be made to do useful work in an external load. The optical-to-electrical conversion efficiency can be enhanced by employing a p-i-n photodiode configuration in which the impurity concentration of the i-layer is low enough to produce complete depletion. A depleted i-layer, often called the active layer where light is primarily absorbed, means that pairs can be readily separated and do not recombine producing a useful photocurrent. Although the i-layer should be made thick enough to absorb a substantial fraction of the light incident thereon, it is often made even thicker to reduce leakage current, increase the reverse breakdown voltage, and lower the capacitance of the photodiode. On the other hand, the maximum thickness of the i-layer is limited primarily by the required speed of operation.

Realizing low-doped i-layers can often be a problem depending on the materials from which the photodiode is made and the fabrication techniques employed. For example, suitable p-i-n photodiodes can be made of silicon using, inter alia, high resistivity (>300 $\Omega$-cm) epitaxial layers and ion-implantation (see, U.S. Pat. No. 4,127,932 granted to A. R. Hartman et al), yet the ability to controllably fabricate similar devices from Group III-V compound semiconductors is complicated by the difficulty of making low-doped material (e.g., $10^{15}$ cm$^{-3}$). This problem in turn limits the maximum depletion width attainable and hence places constraints on desired levels of leakage current, breakdown voltage, and capacitance. There is a need, therefore, to be able to fabricate relatively wide (e.g., 10 $\mu$m) depletion layers in more highly doped (e.g., mid-$10^{16}$ cm$^{-3}$) Group III-V compound semiconductors.

The fabrication of prior art photodiodes is also disadvantageous because of the need to grow a plurality of epitaxial layers of controlled composition, conductivity type and thickness often involving sophisticated growth procedures (e.g., LPE, MBE, VPE) and a complicated sequence of ion-implantation and/or diffusion steps. So, there is also a need to simplify the fabrication of photodiodes and, thereby, to increase reproducibility and reduce costs.

SUMMARY OF THE INVENTION

We have devised a relatively simple, reproducible and inexpensive procedure for fabricating a p-i-n photodiode in moderately lowly doped Group III-V compound semiconductor n$^-$-type body in which a single acceptor diffusion step produces both the p-i junction and the i-n junction separated by a fully depleted, relatively thick p$^-$ active i-region. Depleted active regions thicker than 10 $\mu$m can be controllably fabricated in semiconductor bodies having a carrier concentration as high as the mid-$10^{15}$ cm$^{-3}$ range.

More specifically, we exploit the characteristic of certain acceptors under particular conditions to deviate from expected error function diffusion profiles and to form an anomalous concave section resulting in two diffusion fronts. This anomalous profile includes upper and lower monotonically decreasing segments joined by the upwardly concave section, with the upper segment being closer to the surface and the lower segment being deeper. By performing this type of anomalous diffusion into an n-type body doped to a carrier concentration below that corresponding approximately to the concave section, a junction is formed at a depth corresponding approximately to that of the concave section, and a p$^-$- n$^-$ junction is formed at a depth corresponding to the intersection of the lower segment and the carrier concentration of the n$^-$-body. The p$^-$-region between the junctions is depleted and forms the active i-region where light is absorbed and photocarriers are generated. The thickness of the active region is controlled by controlling the difference in doping level of the body and that of the concave section.

Although numerous prior art workers have studied these anomalous diffusion profiles, none has fabricated photodiodes incorporating the characteristic. Representative of the prior art studies are the following:

| | |
|---|---|
| GaAs:Zn | B. Tuck et al, Journal of Materials Science, Vol. 7, page 585 (1972) |
| InP:Zn | B. Tuck et al, J. Phys. D: Appl. Phys., Vol. 8, page 1806 (1975) |
| GaP:Zn | L. L. Chang et al, J. Appl. Phys., Vol. 35, page 374 (1964) |
| GaAs:Mn | M. S. Seltzer, J. Phys. Chem. Solids, Vol. 26, page 243 (1965) |
| Ge:Cu | F. Van der Maesen et al, J. |
| Ge:Ni | Electrochem. Soc., Vol. 102, page 229 (1955) |
| CdS:Ag | H. H. Woodbury, J. Appl. Phys., Vol. 36, page 2287 (1965) |
| InP:Cd | B. I. Miller and P. K. Tien, 21st EMC, Abs. No. G4 (6/1979) |
| InP:Cd | P. K. Tien and B. I. Miller, Appl. Phys. Lett., Vol. 34, page 701 (5/1979) |

Indicative of the failure of prior art workers to recognize the utility of the anomalous diffusion profile in, for example, InP:Cd or Zn, is the report by T. P. Lee et al, *Appl. Phys. Lett., Vol.* 35, page 511 (10/1979). This paper describes InP photodiodes in which Zn or Cd diffusion was employed to make simple p-n junctions but, notwithstanding the earlier work of Tuck (1975) and the two works of Miller and Tien (1979), did not exploit the anomalous diffusion of these acceptors in any way.

In contrast, we fabricated abrupt p$^+$—p$^-$-n$^-$ junctions in nominally undoped InP n$^-$-substrates under conditions that produced the anomalous double diffusion profile. The shallow front (i.e., the $p^+$—$p^-$ junction) marked the concave section of the profile, and the deep front corresponded to the $p^-$—$n^-$ junction. The depletion region extended between the two fronts. To achieve this profile, we found the Cd activity should be less than about 0.15 at a substrate temperature of 680 degrees C. Unlike previous work which used Cd compounds (Tien and Miller, suppa), we diffused Cd into n-type InP ($4\times10^{16}$ cm$^{-3}$) in sealed ampoules using elemental source. The diffusion depths were controlled by varying the diffusion time or the concentration of either In or P.

Mesa photodiodes characterized by large reverse breakdown voltages, low leakage current, and wide depletion widths were fabricated using this technique. These photodiodes are suitable for detection of light at wavelengths $\lambda \leq 0.96$ μm.

BRIEF DESCRIPTION OF THE DRAWINGS

Our invention, together with its various features and advantages, can be readily understood from the following more detailed description taken in conjunction with the accompanying drawing in which.

DETAILED DESCRIPTION

Figure 1:
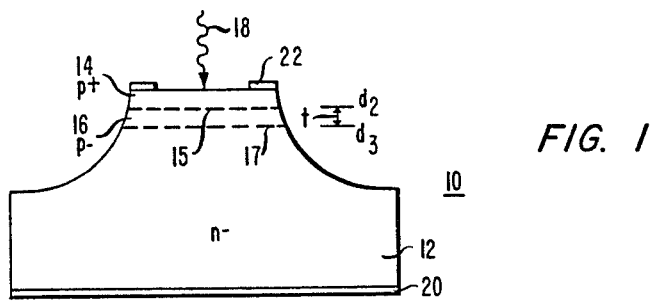
FIG. 1 is a cross-sectional view of a mesa photodiode in accordance with one embodiment of our invention.

With reference now to FIG. 1, there is shown a p-i-n photodiode e.g. $p^+$—$p^-$—$n^-$ photodiode 10 which, in accordance with one aspect of our invention, is fabricated by means of a single diffusion step performed under conditions which result in an anomalous double diffusion profile. The photodiode 10 includes a relatively low-doped $n^-$-type semiconductor body 12, which may be a substrate of single crystal semiconductor or such a substrate with one or more epitaxial layers (not shown) grown thereon. By suitable single step acceptor diffusion described hereinafter, a surface layer 14 of body 12 is converted to $p^+$-type and an underlying layer 16 is converted to $p^-$-type. The latter layer of thickness t is the active region of the photodiode where light 18 is primarily absorbed and generates photocarriers. These carriers are collected by suitable electrical contacts, illustratively a broad area contact 20 on the bottom of body 12 and an annular contact 22 on the top of layer 14. Light 13 passes through the annulus of contact 22 to the active region. Typically, for high speed detection a reverse bias is applied across contacts 20 and 22. The photocurrent, whether generated in the photovoltaic or reverse bias mode, then can do work in an external load (not shown) connected across these contacts. Illustratively, photodiode 10 is formed in the shape of a mesa, typically to reduce device capacitance.

Figure 3:
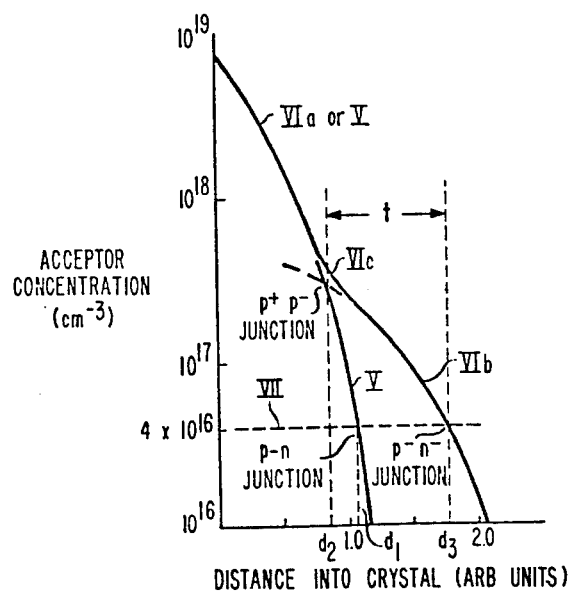
FIG. 3 is a calculated graph of the normal error function diffusion profile (curve V) and the anomalous double diffusion profile (curve VI). For $n^- = 4\times10^{16}$ cm$^{-3}$ (line VII) substrate doping level, one junction ($p^+$-$n^-$) would be formed at a depth $d_1$ for a normal diffusion profile, whereas two junctions ($p^+$—$p^-$ and $p^-$-$n^-$) are formed at $d_2$ and $d_3$ for an anomalous profile.

In order to realize an anomalous diffusion profile, such as shown by curve VI of FIG. 3, three basic conditions should be observed: (1) the diffusing acceptor should have a high diffusivity, e.g., a fast diffusing impurity such as Cu or Ni in Ge and Zn or Cd in Group III-V compounds; (2) the surface concentration of the impurity should be relatively high (e.g., in the upper $10^{18}$ cm$^{-3}$ range), and (3) the diffusion time should be relatively long; i.e., more than a few minutes to insure that acceptors have time to penetrate deep enough into the body to form the deeper p-n junction, but less than many hours to prevent equilibration; 1 to 4 hours is suitable for InP:Cd. Furthermore, in order to exploit the anomalous diffusion profile to make a $p^+$—$p^-$—$n^-$ photodiode, the carrier concentration (line VII, FIG. 3) of the low-doped body 12 must be less than net impurity concentration corresponding to the concave section VIc. Under these circumstances, the shallow diffusion profile VIa produces a $p^+$—$p^-$ function at depth $d_2$ corresponding approximately to the concave section VIc, whereas the deeper diffusion profile VIb forms a $p^-$-$n^-$ junction at depth $d_3$ corresponding to its intersection with line VII. The width $t = d_3 - d_2$ of the active region between these junctions is controlled by the difference in carrier concentrations between concave section (VIc) and body 12 (line VII). Advantageously, this active region is at least partially depleted (because it is compensated) and can be made relatively wide (e.g., 10 μm), thereby decreasing leakage current, increasing reverse breakdown voltage, and lowering capacitance.

EXAMPLE

The following example describes the fabrication of a $p^+$—$p^-$—$n^-$ InP photodiode by a single step diffusion of Cd.

In this example, Cd was diffused into n-type InP using elemental (Cd and P) or (Cd and In) as sources. $p^+$—$p^-$—$n^-$ junctions were formed using either Cd source. Higher reverse breakdown voltages and lower reverse leakage current, exceeding those of state-of-the-art, abrupt $p^+$-$n^-$ InP avalanche photodiodes (APDs), were obtained from our $p^+$—$p^-$—$n^-$ diodes.

Unintentionally doped ($4\times10^{16}$ cm$^{-3}$) InP substrates (e.g., body 12) were cut along the <100> orientation from twin free, liquid encapsulated (LEC) grown crystals. One surface of the substrates was polished using Br-methanol in order to accurately determine the diffusion depth and to qualitatively assess the degree of thermally induced decomposition of the surface. The diffusion anneals were carried out in sealed quartz ampoules for four hours at 680 degrees C. in a vertical furnace with the diffusion source at 675 degrees C. to prevent condensation of droplets onto the InP water. The ampoule volume and amount of Cd were held constant from run to run at 5 cm$^3$ and 3.5 mg, respectively. The diffusion depth was controlled by varying the diffusion time or the concentration of either In or P. The diffusion front was revealed by staining a cleaved edge with a wellknown AB etch at room temperature for five minutes. Examination of the diffused samples using Nomarski interference microscopy showed no significant change in surface quality. Similarly, photoluminescence measurements of the diffused samples were consistent with the absence of surface damage.

A Normarski optical micrograph was made to observe the typical stained edge of a nominally undoped, n-type InP ($4\times10^{16}$ cm$^{-3}$) wafer after Cd diffusion. Two diffusion fronts 15 and 17 (FIG. 1) were formed, one at a depth $d_2$ of 11.4 μm and the other at a depth $d_3$ of 24.6 μm for an amount of P in the diffusion source equal to about 3.4 mg. The two fronts were either changes in doping density or dopant type since etching revealed both types of variations. Examination of the stained edge with a scanning electron microscope (SEM) showed that a step, ~0.2 μm deep, was delineated at the shallow diffusion front 15 for five minutes etch time; no step was observed at the deep front 17 even after thirty minutes etch time.

A high magnification electron beam induced current (EBIC) image of the sample was also made, and the positions of the shallow and deep diffusion fronts obtained from the optical micrograph were compared. This EBIC profile demonstrated the nature of the junction. The EBIC signal reached a peak at the shallow front 15, remained at the peak value for ~3 μm, and decreased to a second inflection point at the position of the deep front 17. The EBIC measurement thus revealed the presence of a depletion region (active region 16) bounded by the two fronts. The EBIC profile was characteristic of a $p^+$—$p^-$-$n^-$ junction.

Further investigation of the active region 16 bounded by the two diffusion fronts was made using thermal probing and photoluminescence. Using a 2 percent Br-methanol solution, a surface layer, approximately 20 μm thick, was removed from a top portion of the wafer. A thermal probe measurement of the original surface of the sample showed it to be strongly p-type. Thermal probing of the etched surface at 20 μm depth showed it to be low doped; the conductivity type could not be determined. Low temperature (4.2 degrees K) photoluminescence measurements also indicated a high Cd concentration at the original surface. Similar photoluminescence measurements of the etched surface indicated that it was p-type as shown by the width and strength of the Cd impurity line at 1.365 eV. An amount of Cd, lower than the surface concentration by about an order of magnitude was found. The formation of a $p^+$—$p^-$-$n^-$ junction was thus confirmed by EBIC, thermal probing, and photoluminescence measurements.

Figure 2:
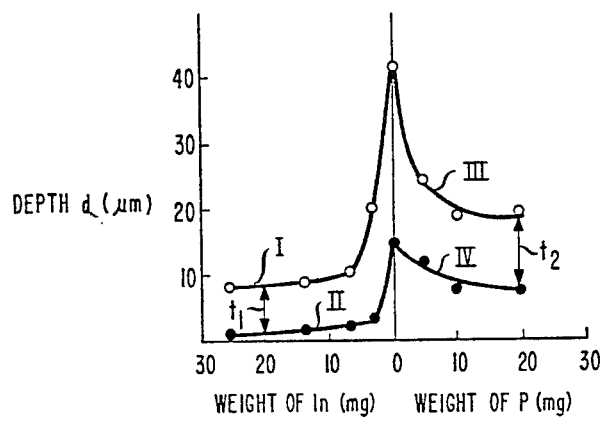
FIG. 2 is a graph of diffusion depth in InP versus the In and P concentration of the diffusion source in which the Cd concentration, temperature, and ampoule volume were 3.5 mg, 680 degrees C., and 5 cm$^3$, respectively.

FIG. 2 summarizes the results of diffusing Cd into undoped ($4 \times 10^{16}$ cm$^{-3}$) n$^-$-type InP. The diffusion depths for both shallow and deep fronts versus the amount of either P or In in the source are plotted; i.e., curves I and II correspond to the shallow $p^+$—$p^-$ junction 15 and the deeper $p^-$-$n^-$ junction 17, respectively, for an In-Cd source, whereas curves III and IV represent the same junctions for a P-Cd source. For example, at 20 mg of In, the distance between curves I and II gives a $p^-$-active region 16 which is about $t_1 = 8$ μm thick. Similarly, at 20 mg of P, the active region thickness is about $t_2 = 10$ μm. The data show that the diffusion depths decrease for increasing amounts of either P or In and that the dependence of diffusion depth on In concentration in the ampoule is greater than for P. Although the dependence on P has been previously demonstrated by Tien and Miller, supra, the dependence on In is presented for the first time.

We also found that at a substrate temperature of 680 degrees C., and for an In-Cd diffusion source, the anomalous profile was produced only for Cd activities in excess of about 0.15. No similar limitation was observed, however, for a P-Cd source. We believe that Cd activities less than 0.15 at this temperature effectively reduce the surface concentration of acceptors below the desired upper $10^{18}$ cm$^{-3}$ range and thus prevent the formation of two junctions.

It should be noted that the Cd activity limit is also a function of substrate temperature. At higher temperatures, as the vacancy concentration increases, a higher Cd activity than 0.15 is required. At present, however, we do not understand why there is no similar limit for a P-Cd source. In any event, we expect that the anomalous profile can be attained in bulk InP using the above-described procedure with diffusion temperatures in the range of about 680 to 850 degrees C. We have successfully obtained such profiles for diffusion times in the range of 1 to 4 hours at 680 degrees C.

The formation of a $p^+$—$p^-$-$n^-$ junction in InP which is delineated as two diffusion fronts by etching can be understood from FIG. 3. Curves V and VI represent the normal error function profile and the anomalous double diffusion profile of Cd in InP, respectively. Curve VI deviates from curve V for depths greater than the concave section VIc of curve VI. For the normal diffusion profile, only the position where the diffusing species is equal to the substrate doping level, i.e., the p-n junction at $d_1$, is revealed by etching. If the diffusion profile is that of curve VI, two possibilities arise. For substrates doped above the level of the concave section, one front is present as discussed for curve V. However, for substrates doped (line VII) below concave section VIc, etching reveals both the $p^-$-$n^{31}$ junction at $d_3$ and the position of the concave section in the anomalous diffusion profile, i.e., the $p^+$—$p^-$ junction at $d_2$.

To demonstrate the quality of the $p^+$—$p^-$-$n^-$ junctions, mesa diodes were fabricated from a Cd diffused wafer with the $p^+$—$p^-$ and —$n^-$ junctions at 3.1 μm and 20.0 μm, respectively. The diffusion source comprised 3.5 mg Cd and 3.4 mg In. Mesas were defined by standard photolithography techniques and etched using 2 percent Br-methanol. Be/Au and Sn/Au were used for the p-contact 22 and n-contact metallization 20, respectively. The I-V characteristics of these mesa diodes, 150 μm in diameter, showed a reverse breakdown voltage between 90 V and 220 V and a reverse leakage current from ~5 pA to ~10 pA at half breakdown. The reverse I-V characteristics of the diode with the highest breakdown voltage exhibited double breakdown, at 160 V and 220 V and was typical of the devices. The two breakdowns are probably due to the variation in dopant concentration across the $p^-$-region but are not an intrinsic property of the device.

For a donor carrier concentration of $4 \times 10^{16}$ cm$^{-3}$, the avalanche breakdown voltage of state-of-the-art, abrupt $p^+$-$n^-$ InP APDs is ~30 V (see T. P. Lee et al, supra). The $p^+$—$p^-$-$n^-$ diodes fabricated in this study from $n^- = 4 \times 10^{16}$ cm$^{-3}$ InP crystals had breakdown voltages exceeding that of $p^+$-$n^-$ diodes by a factor of ~3 to ~6. The higher breakdown voltage of the $p^+$—$p^-$-$n^-$ diodes is due to the reduction of the junction electric field by the formation of the $p^-$-region.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, while only InP:Cd photodiodes have been shown by example, it is apparent that the anomalous diffusion profile in other materials using other acceptors can be exploited in a similar fashion; e.g., Group III-V compounds such as GaAs:Zn, InP:Zn, GaP:Zn, GaAs:Mn, InGaAsP:Cd or Zn; and other semiconductors such as Ge:Cu or Ni and CdS:Ag.

We claim:

1. A method of fabricating a photodiode (10) having a depleted i-type active region (16) of a predetermined thickness bounded by a p-i type first junction (15) and an i-n second junction (17), comprising the steps of:
   diffusing an acceptor into a low-doped $n^-$-type semiconductor body (12) so as to form an anomalous diffusion profile (FIG. 3) of net impurity concentration versus depth therein, said profile including upper and lower monotonically decreasing segments (VIa and b) connected by an upwardly concave segment (VIc),
   controlling the conditions of said diffusing step so that the carrier concentration of said body (VII) is below that corresponding to said concave segment, thereby forming said first junction (15) at approximately the depth of said concave segment and said second junction (17) at a depth corresponding to the intersection of said lower segment (VIb) and the carrier concentration of said body, and
   maintaining the difference in carrier concentration between that of said concave segment and that of said body so that said junctions are formed at depths separated by a distance essentially equal to said predetermined thickness of said active region.

2. The method of claim 1 wherein said body comprises a Group III-14 V compound and said diffusing step includes diffusing an impurity selected from the group consisting of Mn, Zn and Cd.

3. The method of claim 2 wherein said body comprises InP and said diffusing step includes diffusing Cd.

4. The method of claim 3 wherein said diffusing step is performed using an elemental source comprising Cd and an element selected from the group consisting of In and P.

5. The method of claim 4 wherein said source comprises In-Cd, said body is maintained at a temperature of about 680 degrees C., and the Cd activity in said source exceeds about 0.15.

6. The method of claims 3 or 4 wherein said diffusing step takes place in a sealed ampoule for a time in the range of about one to four hours at a temperature of said body in the range of 630 to 850 degrees C.

7. The method of claim 6 wherein the depth of said junctions is controlled by varying the concentration of said In or P in said source.

8. The method of claim 1 wherein said active region is $p^-$-type, said first junction, is a $p^+$—$p^-$ junction and said second junction is a $p^-$–$n^-$ junction.

* * * * *